(12) United States Patent
Cheng et al.

(10) Patent No.: US 9,985,030 B2
(45) Date of Patent: May 29, 2018

(54) FINFET SEMICONDUCTOR DEVICE HAVING INTEGRATED SIGE FIN

(71) Applicant: International Business Machines Corporation, Armonk, NY (US)

(72) Inventors: Kangguo Cheng, Schenectady, NY (US); Hong He, Schenectady, NY (US); Ali Khakifirooz, Mountain View, CA (US); Chiahsun Tseng, Wynantskill, NY (US); Chun-chen Yeh, Clifton Park, NY (US); Yunpeng Yin, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 4 days.

(21) Appl. No.: 14/581,135

(22) Filed: Dec. 23, 2014

(65) Prior Publication Data
US 2015/0287614 A1    Oct. 8, 2015

Related U.S. Application Data

(60) Provisional application No. 61/976,130, filed on Apr. 7, 2014.

(51) Int. Cl.
| | |
|---|---|
| *H01L 21/8238* | (2006.01) |
| *H01L 27/092* | (2006.01) |
| *B82Y 40/00* | (2011.01) |
| *H01L 29/66* | (2006.01) |
| *H01L 29/10* | (2006.01) |

(Continued)

(52) U.S. Cl.
CPC ......... *H01L 27/0924* (2013.01); *B82Y 40/00* (2013.01); *H01L 21/823807* (2013.01); *H01L 21/823821* (2013.01); *H01L 29/1054* (2013.01); *H01L 29/66545* (2013.01);
(Continued)

(58) Field of Classification Search
CPC ....... H01L 21/32105; H01L 21/823821; H01L 29/165; H01L 21/2225; H01L 27/0924; H01L 21/823807; H01L 21/321; H01L 27/092; H01L 21/22
See application file for complete search history.

(56) References Cited

U.S. PATENT DOCUMENTS

| | | |
|---|---|---|
| 6,642,090 B1 | 11/2003 | Fried et al. |
| 7,531,393 B2 | 5/2009 | Doyle et al. |

(Continued)

OTHER PUBLICATIONS

Smith et al., "Dual channel FinFETs as a single high-k/metal gate solution beyond 22nm node", 2009 IEEE International Electron Devices Meeting (IEDM), 2009, 4 pages.

*Primary Examiner* — Charles Garber
*Assistant Examiner* — Abdulfattah Mustapha
(74) *Attorney, Agent, or Firm* — Cantor Colburn LLP; Vazken Alexanian

(57) ABSTRACT

A method of fabricating a semiconductor device includes forming at least one semiconductor fin on a semiconductor substrate. A cladding layer is epitaxially grown on a portion of the at least one semiconductor fin. The cladding layer is oxidized such that r such that ions are condensed therefrom and are diffused into the at least one semiconductor fin while the cladding layer is converted to an oxide layer. The oxide layer is removed to expose the at least one semiconductor fin having a diffused fin portion that enhances electron hole mobility therethrough.

17 Claims, 17 Drawing Sheets

(51) Int. Cl.
 *H01L 29/06* (2006.01)
 *H01L 21/02* (2006.01)
 *H01L 21/306* (2006.01)

(52) U.S. Cl.
 CPC .. *H01L 29/66795* (2013.01); *H01L 21/02236* (2013.01); *H01L 21/30604* (2013.01); *H01L 29/0673* (2013.01)

(56) References Cited

U.S. PATENT DOCUMENTS

| | | |
|---|---|---|
| 7,674,669 B2 | 3/2010 | Hanafi |
| 7,993,999 B2 | 8/2011 | Basker et al. |
| 2005/0077553 A1 | 4/2005 | Kim et al. |
| 2008/0145985 A1* | 6/2008 | Chi ........................ B82Y 10/00 438/199 |
| 2009/0007036 A1* | 1/2009 | Cheng ................... H01L 21/845 716/106 |
| 2011/0024804 A1 | 2/2011 | Chang et al. |
| 2011/0108920 A1* | 5/2011 | Basker .................. H01L 21/845 257/351 |
| 2011/0210393 A1 | 9/2011 | Chen et al. |
| 2012/0091528 A1 | 4/2012 | Chang et al. |
| 2012/0280289 A1 | 11/2012 | Flachowsky et al. |
| 2013/0113037 A1* | 5/2013 | Masuoka ................ H01L 29/78 257/329 |
| 2013/0196478 A1* | 8/2013 | Chang ................ H01L 29/7853 438/283 |
| 2014/0027816 A1* | 1/2014 | Cea ................... H01L 29/66545 257/192 |

\* cited by examiner

FINFET SEMICONDUCTOR DEVICE HAVING INTEGRATED SIGE FIN

DOMESTIC PRIORITY

This application is a non-provisional of U.S. Patent Application Ser. No. 61/976,130, filed Apr. 7, 2014, the disclosure of which is incorporated by reference herein in its entirety.

BACKGROUND

The present invention relates to finFET semiconductor devices, and more specifically, to a finFET including an integrated silicon germanium/silicon (SiGe/Si) fin structure.

Conventional finFET semiconductor devices include a gate that fully wraps one or more semiconductor fins formed from Si. The wrapped gate can improve carrier depletion in the channel defined by the Si fin. Accordingly, electrostatic control of the channel defined by the Si fin may be improved.

Recent semiconductor fabrication methods have been developed to replace pure Si fins with SiGe fins. Forming the fins from SiGe reduces the threshold voltage (Vt) of the semiconductor device, thereby increasing the drive current that flows through the channel. Further, SiGe material provides higher carrier mobility than Si. Accordingly, SiGe fins may have improve electron hole mobility performance with respect to Si fins. Conventional methods, however, are limited to forming fins having a low concentration of germanium. Conventional methods may also form SiGe fins by epitaxially growing a SiGe layer from a Si seed layer, which forms a physical junction between the SiGe fin and the Si seed layer. Epitaxially growing the SiGe fin, however, may result in non-uniform fin grown and various defects that occur during the growth process.

SUMMARY

According to one embodiment a method of fabricating a semiconductor device includes forming at least one semiconductor fin on a semiconductor substrate. A cladding layer is epitaxially grown on a portion of the at least one semiconductor fin. The cladding layer is oxidized such that r such that ions are condensed therefrom and are diffused into the at least one semiconductor fin while the cladding layer is converted to an oxide layer. The oxide layer is removed to expose the at least one semiconductor fin having a diffused fin portion that enhances electron hole mobility therethrough.

According to another embodiment, a method of fabricating a semiconductor device comprises forming at least one semiconductor fin on a semiconductor substrate, and forming a gate stack including a dummy gate on the at least one semiconductor fin. The method further includes removing the dummy gate to expose a portion of the at least one semiconductor fin. The method further includes epitaxially growing a cladding layer on the exposed portion of the at least one semiconductor fin. The method further includes oxidizing the cladding layer such that ions are condensed therefrom and are diffused into the at least one semiconductor fin while the cladding layer is converted to an oxide layer. The method further includes removing the oxide layer to expose the at least one semiconductor fin having a diffused fin portion that defines a gate channel of the semiconductor device.

In yet another embodiment, a semiconductor device comprises a semiconductor substrate. At least one semiconductor fin is formed on the semiconductor substrate. The at least one semiconductor fin includes a diffused portion comprising first and second ions, and a non-diffused portion excluding the second ions. The diffused portion is integrated within the semiconductor fin and enhances electron hole mobility therethrough.

Additional features are realized through the techniques of the present invention. Other embodiments are described in detail herein and are considered a part of the claimed invention. For a better understanding of the invention and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features of the various embodiments are apparent from the following detailed description taken in conjunction with the accompanying drawings in which:

DETAILED DESCRIPTION

Figure 1:
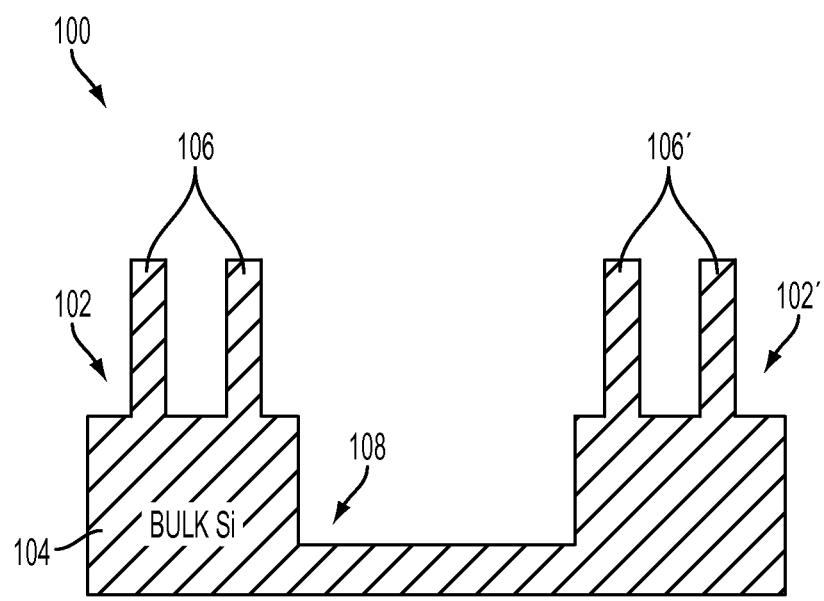
FIG. 1 illustrates a semiconductor device including first and second semiconductor structures having a plurality of semiconductor fins patterned on a bulk substrate.

Referring to FIG. 1, a semiconductor device 100 is indicated according to an exemplary embodiment. The semiconductor device 100 includes a first semiconductor structure 102 and a second semiconductor structure 102'. The first and second semiconductor structures 102/102' may be formed as a p-type field effect transistor (i.e., a PFET). Although a plurality of semiconductor structures 102/102' are illustrated, it is appreciated that the semiconductor device 100 may include a single semiconductor structure 102.

The first and second semiconductor structures 102/102' are formed from a bulk semiconductor substrate 104 such as, for example, a bulk silicon (Si) substrate. Each of the first and second semiconductor structures 102/102' have one or more semiconductor fins 106/106' formed on the bulk substrate 104. The semiconductor fins 106/106' may be formed by patterning the bulk substrate 104 using, for example, a sidewall image transfer (SIT) process as understood by those ordinarily skilled in the art. A trench 108 may also be formed in the bulk substrate 104 to isolate the first semiconductor structure 102 from the second semiconductor structure 102'. It is appreciated that although a bulk semiconductor substrate 104 is illustrated, the semiconductor fins 106/106' may be formed on a semiconductor-on-insulator (SOI) substrate as understood by those ordinarily skilled in the art.

Figure 2:
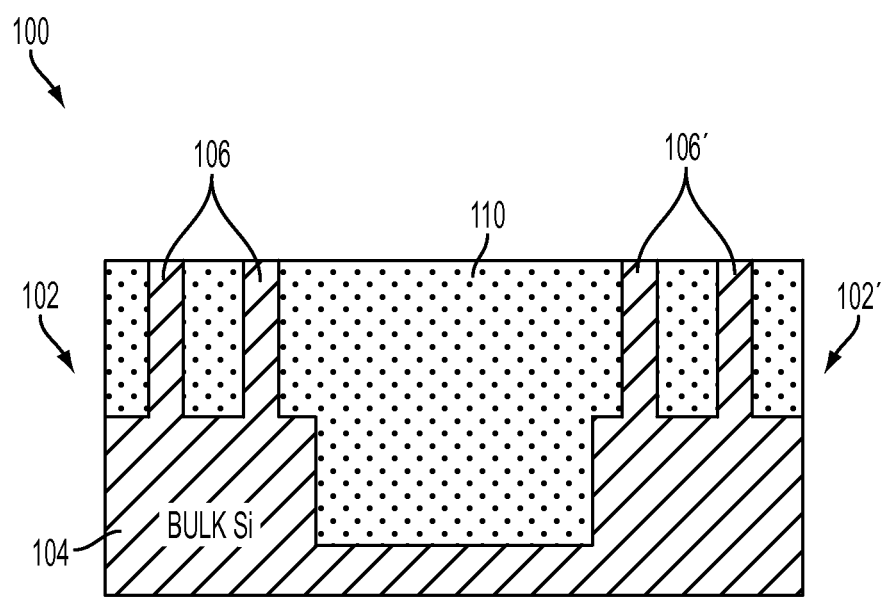
FIG. 2 illustrates the semiconductor device of FIG. 1 following deposition of an oxide layer that covers the semiconductor fins.

Turning to FIG. 2, a block masking layer 110 is deposited on the semiconductor device 100 to cover the semiconductor fins 106/106'. A chemical vapor deposition (CVD) process may be used to deposit the block masking layer 110 along the bottom surface and sidewalls of the trench 108. The block masking layer 110 may also be deposited between the semiconductor fins 106/106' to cover the fin sidewalls and upper surface thereof. The block masking layer 110 may be formed from various materials including, for example, silicon oxide ($SiO_2$). A chemical-mechanical planarization (CMP) process may be performed such that the block masking layer 110 is recessed and flush with the upper surface of the semiconductor fins 106/106' as further illustrated in FIG. 2.

Figure 3:
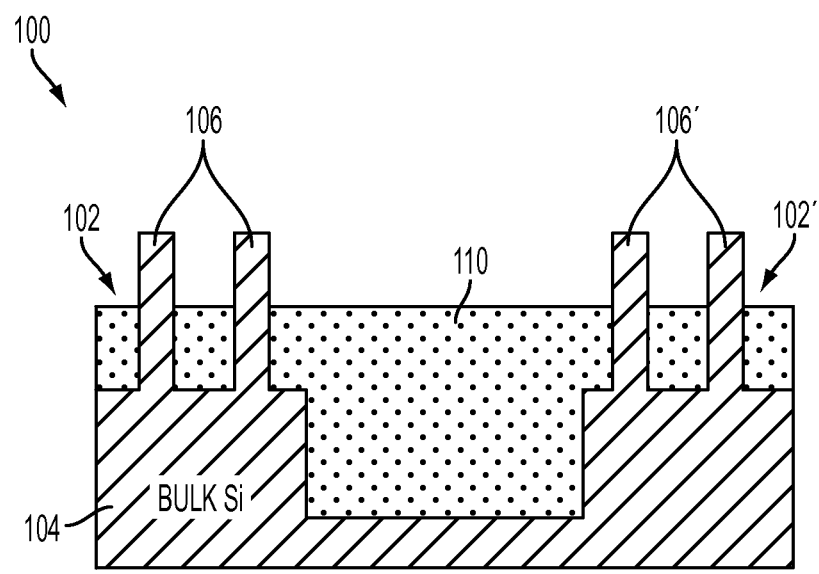
FIG. 3 illustrates the semiconductor device of FIG. 2 after removing a portion of the oxide layer to expose an upper portion of the fins.

Referring now to FIG. 3, upper portions of the semiconductor fins 106/106' are exposed after removing a portion of the block masking layer 110 at the trench region and between the semiconductor fins 106/106' using, for example, a reactive ion etching (RIE) process. The RIE process may be selective to silicon, for example. The amount of block masking layer 110 removed may vary based on the desired height of the semiconductor fin 106/106'. That is, the height of the fin 106/106' defining the portion that will undergo thermal oxidation (discussed in greater detail below) may be tuned (i.e., adjusted) according to the amount of block masking layer 110 that is removed. The remaining portion of the semiconductor fin 106/106' is therefore a non-diffused portion.

Figure 4:
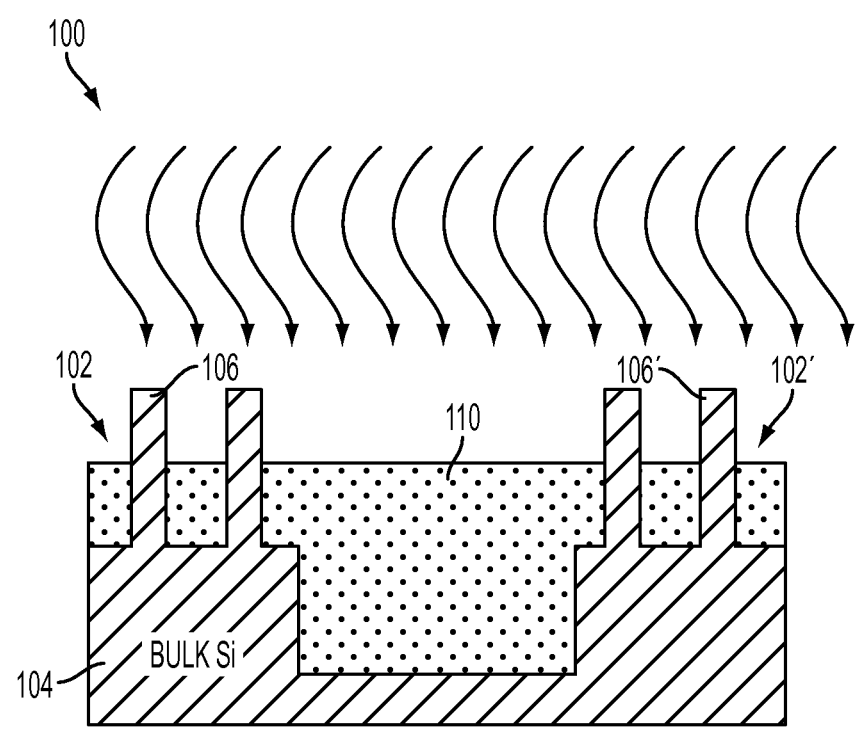
FIG. 4 illustrates the semiconductor device of FIG. 3 undergoing an annealing operation to anneal the exposed portions of the semiconductor fins.

Turning now to FIG. 4, the semiconductor device 100 may undergo an annealing process such that the exposed portion of the semiconductor fins 106/106' is annealed. The annealing process may cure defects in the exposed portions of the semiconductor 106/106'. Accordingly, an improved surface for growing an epitaxial layer from the exposed upper surface and sidewalls of the fins 106/106' may be provided.

Figure 5:
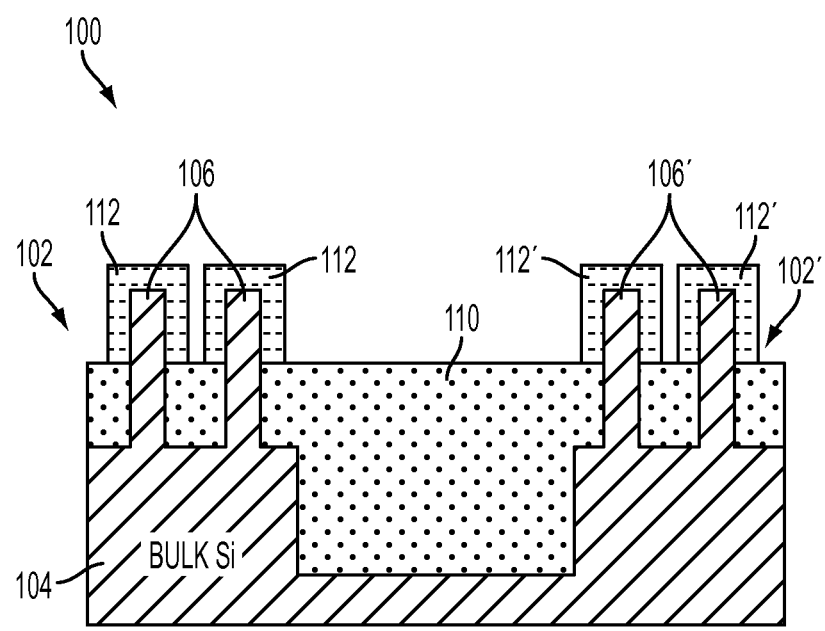
FIG. 5 illustrates the semiconductor device of FIG. 4 showing a silicon germanium cladding layer epitaxially grown on the exposed surfaces of the semiconductor fins.

Referring now to FIG. 5, a cladding layer 112 is epitaxially grown on the upper portion and sidewalls of the exposed semiconductor fins 106/106'. According to an embodiment, the cladding layer 112 is a silicon germanium (SiGe) cladding layer 112. The cladding layer 112 may have a thickness in the lateral and/or vertical direction ranging, for example, from approximately 15 nanometers (nm) to approximately 20 nm.

Figure 6:
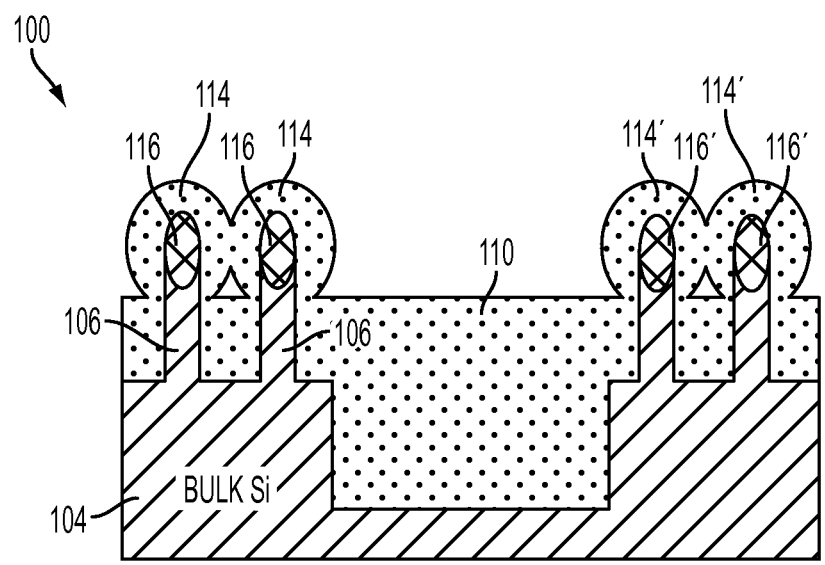
FIG. 6 illustrates the semiconductor device of FIG. 5 undergoing a thermal oxidation process that condenses the germanium ions into the semiconductor fins and converts the silicon germanium cladding layer into silicon oxide.

Referring now to FIG. 6, the semiconductor device 100 is shown following thermal oxidation of the SiGe cladding layer 112. Thermal oxidation of the SiGe cladding layer 112 forms a sacrificial oxide layer 114 around the sidewalls and upper surface of the exposed semiconductor fins 106/106'. The oxidation also forms a diffused fin portion 116 in the exposed semiconductor fins 106/106'. The sacrificial oxide layer 112 may be formed as, for example, $SiO_2$. According to at least one embodiment, the SiGe cladding layer 112 shown in FIG. 5 is subjected to a dry or wet oxidation process at temperature greater than, for example, approximately 1832° F. (1000° C.) to approximately 1922° F. (1050° C.). As the SiGe cladding layer 112 oxidizes, the germanium (Ge) ions are rejected (i.e., condensed) from the sacrificial oxide layer 114 formed over the exposed semiconductor fins 106/106'. Accordingly, the Ge ions are driven into the semiconductor fins 106/106' to form the diffused fin portions 116, and the SiGe cladding layer 112 is converted into a sacrificial oxide layer 114. The remaining portion of the semiconductor fin 106/106' that excludes the diffused Ge ions may be viewed as a non-diffused portion.

Figure 7:
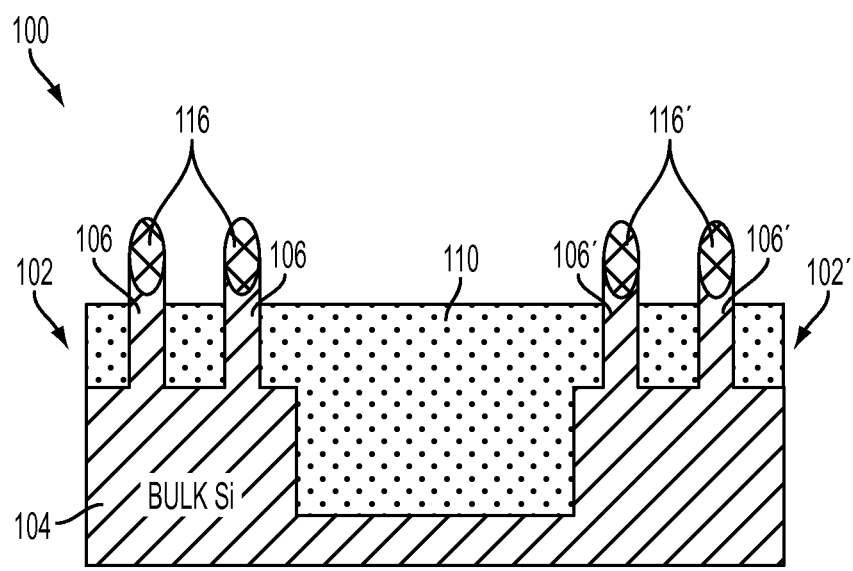
FIG. 7 illustrates the semiconductor device of FIG. 6 after removing the oxide layer formed during thermal oxidation process to expose silicon germanium fins.

Turning now to FIG. 7, the sacrificial oxide layer 114 is removed using, for example a wet etching process, to expose one or more SiGe integrated semiconductor fins. That is, the SiGe integrated fins include the diffused fin portion 116 that is integrated within the fin, as opposed to being grown from an external seed layer surface of the fin. It is appreciated that a portion of the remaining block masking layer 110 may be etched when removing the sacrificial oxide layer 114. Accordingly, a physical junction between the SiGe and the fin is excluded. In at least one embodiment, the diffused portion is integrated completely within the fin.

In addition, the SiGe diffused fin portion 116 may have a high concentration of Ge ions. According to at least one exemplary embodiment, the percentage of Ge ions in the diffused fin portion 116 may be greater than or equal to 50% with respect to the percentage of Si ions. Therefore, a SiGe semiconductor fin having improved and enhanced electron hole mobility may be provided. That is, the electron hole mobility through the SiGe fins is increased and improved with respect to the electron hole mobility through Si the fins 106 that exclude the Ge ions. Although not illustrated, a gate stack may be formed on one or more of the SiGe fins according to various methods understood by those ordinarily skilled in the art. For example, a well-known replacement metal gate (RMG) process may be performed after forming the SiGe fins.

Although FIGS. 1-7 illustrate a process flow for fabricating semiconductor device including first and second similar semiconductor structures (e.g., PFETs), it is appreciated that the process flow illustrated in FIGS. 1-7 may be used to fabricate a semiconductor device including two different structures (e.g., PFET and an NFET).

Figure 8:
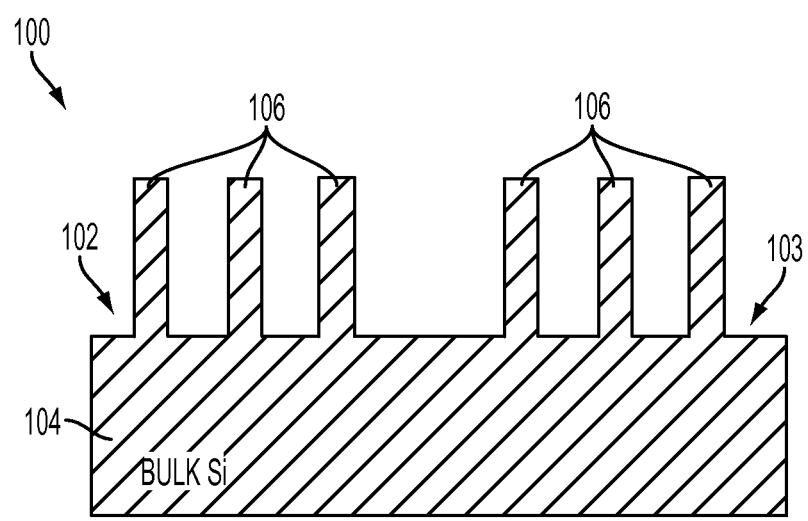
FIG. 8 illustrates a semiconductor device including a first semiconductor structure and a second semiconductor structure formed on a bulk substrate according to another exemplary embodiment.
Figure 9:
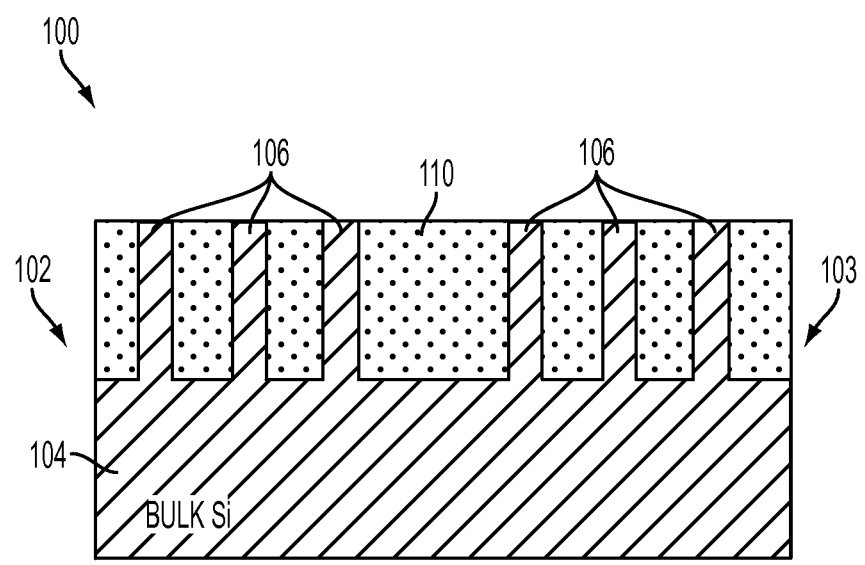
FIG. 9 illustrates the semiconductor device of FIG. 8 following deposition of an oxide layer that covers the semiconductor fins of the first and second semiconductor structures.

Referring to FIG. 8, for example, a semiconductor device 100 includes a first semiconductor structure (e.g., PFET) 102 and a second semiconductor structure (e.g., NFET) 103 formed on a bulk substrate (e.g., a Si substrate) 104. A block oxide layer 100 may be deposited on the semiconductor device 100 to cover the semiconductor fins 106 corresponding to the PFET 102 and the NFET 103 as illustrated in FIG. 9. The block oxide layer 110 may be formed from, for example, $SiO_2$.

Figure 10:
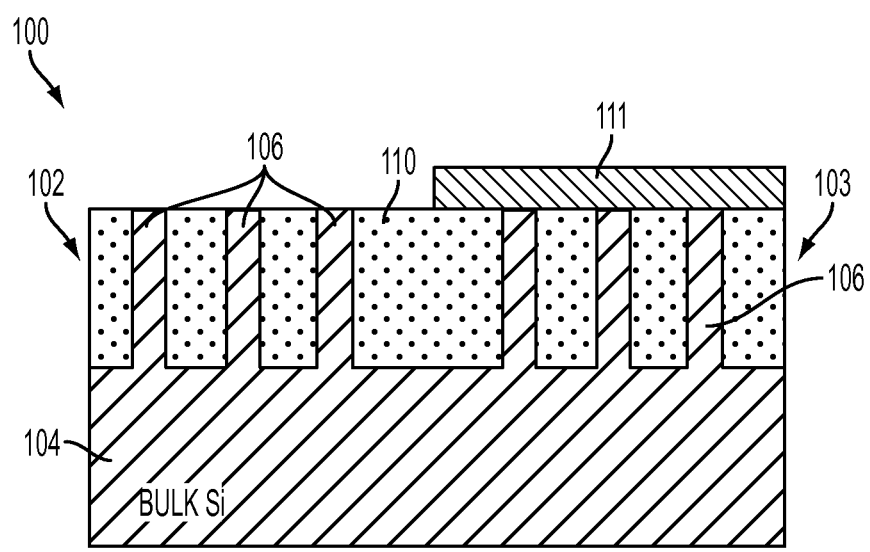
FIG. 10 illustrates the semiconductor device of FIG. 9 following patterning of a masking layer to cover the second semiconductor structures while exposing the oxide layer corresponding to the first semiconductor structure.

Turning to FIG. 10, a block masking layer 111 may be formed on an upper surface of the oxide layer 110 and patterned such that the remaining block masking layer 111 covers the NFET 103, while exposing the oxide block layer 110 corresponding to the PFET. The block masking layer 111 may be formed from, for example, silicon nitride ($Si_3N_4$).

Figure 11:
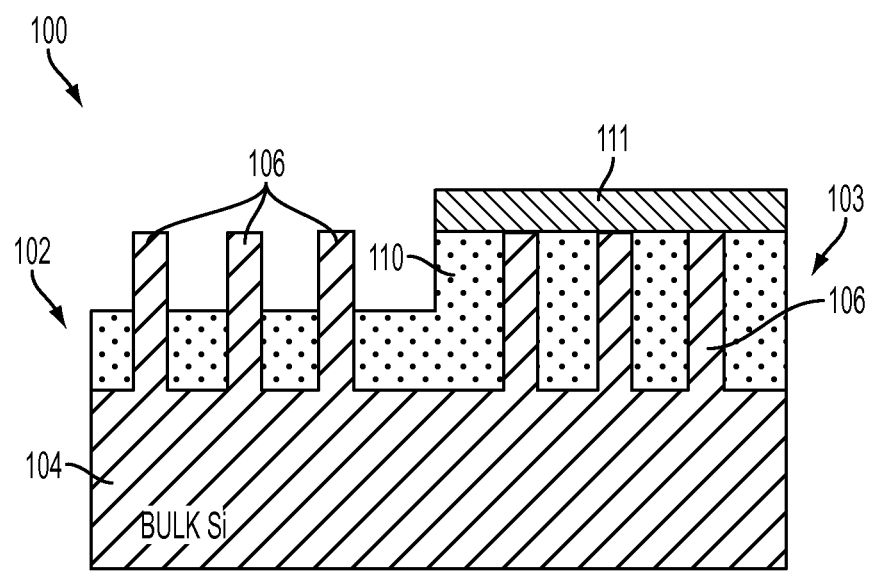
FIG. 11 illustrates the semiconductor device of FIG. 10 after removing a portion of the oxide layer to expose an upper portion of the fins corresponding to the first semiconductor structure.

Referring now to FIG. 11, the exposed block oxide layer 110 may be etched according to an RIE process. The RIE process may be selective to recess the block oxide layer 110, while leaving the fins intact. Accordingly, upper portions of Si fins 106 corresponding to the PFET 102 may be exposed.

Figure 12:
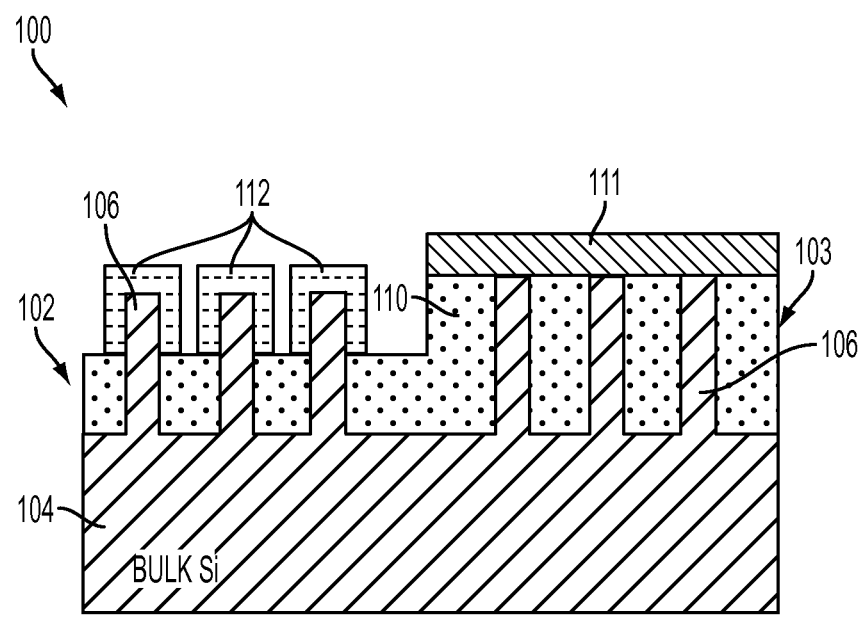
FIG. 12 illustrates the semiconductor device of FIG. 11 showing a silicon germanium cladding layer epitaxially grown on the exposed surfaces of the semiconductor fins corresponding to the first semiconductor structure.
Figure 13:
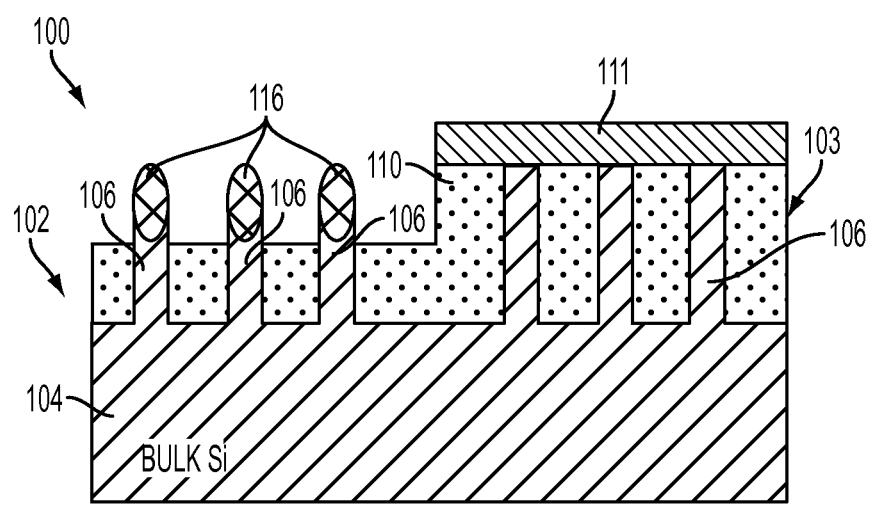
FIG. 13 illustrates the semiconductor device of FIG. 12 following a thermal oxidation process that condenses germanium ions into the semiconductor fins to form silicon germanium fins corresponding to the first semiconductor structure.

In FIG. 12, a SiGe cladding layer 112 may then be epitaxially grown on the exposed Si fins 106 of the PFET 102, while the block masking layer 111 prevents the cladding layer 112 from being grown on the Si fins 106 corresponding to the NFET 103. Although not illustrated, the exposed Si fins 106 may be annealed prior to epitaxially growing the SiGe cladding layer 112 as discussed in detail above. Oxidation of the SiGe cladding layer 112 may then be performed as discussed in detail above to form SiGe fins on the PFET 102, while maintaining Si fins 106 excluding Ge ions on the NFET 103 as illustrated in FIG. 13.

The formation of SiGe semiconductor fins as described above may be performed prior to performing a RMG process for forming a respective gate stack. According to another exemplary embodiment, however, the SiGe fins may be integrated with a RMG process flow.

Figure 14:
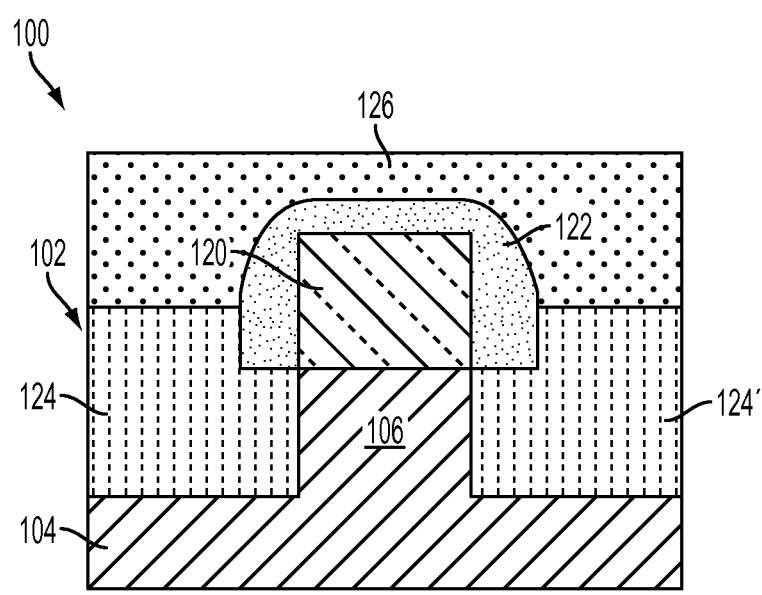
FIG. 14 illustrates a dummy gate stack formed on a semiconductor fin according to another exemplary embodiment.

Turning to FIG. 14, for example, semiconductor device 100 including a first semiconductor structure (e.g., a PFET) 102 is illustrated. The PFET 102 includes a dummy gate stack 120 formed on an upper surface and on the sides of a Si semiconductor fin 106. A spacer 122 is formed on an upper surface and on sidewalls of the dummy gate stack 120. First and second opposing source/drain (S/D) regions 124/124' are formed on opposing sides of the dummy gate stack 122. An upper portion of the Si semiconductor fin 106 is interposed between the first and second S/D regions 124/124' and beneath the dummy gate stack 120 to form a gate channel region. A gate masking block layer 126 is formed on the semiconductor device 100 and covers the first and second S/D regions 124/124', the spacer 122, and the dummy gate stack 120.

Figure 15:
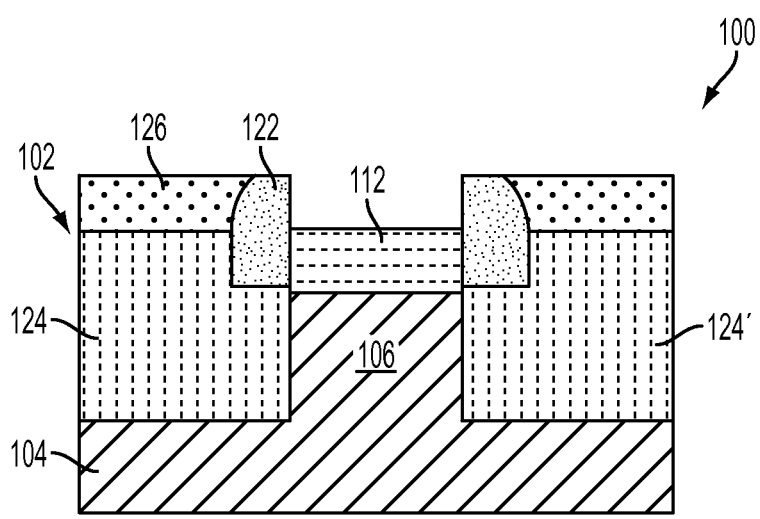
FIG. 15 illustrates the semiconductor device of FIG. 14 having a silicon germanium cladding layer formed on an upper surface of the semiconductor fin following removal of the dummy gate stack.

Turning to FIG. 15, the dummy gate stack 120 may be removed to expose an upper surface of the Si semiconductor fin 106 according to various known RMG processes understood by those ordinarily skilled in the art. A cladding layer, such as a SiGe cladding layer 112 for example, is epitaxially grown on the exposed surface of the Si semiconductor fin 106 as further illustrated in FIG. 15.

Figure 16:
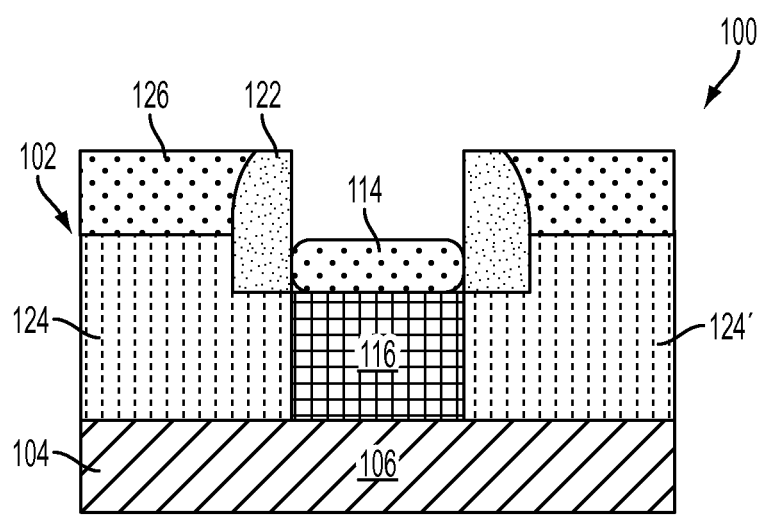
FIG. 16 illustrates the semiconductor device of FIG. 15 following a thermal oxidation process that that condenses germanium ions into the semiconductor fins to form a silicon germanium gate channel and converts the cladding layer into a oxide layer.

Referring now to FIG. 16, the semiconductor device 100 is shown following oxidation of the SiGe cladding layer 112.

The Ge ions, which are condensed from the SiGe cladding layer 112, are diffused into the Si semiconductor fin 106 to form a SiGe diffused fin portion 116 therein. Accordingly, the SiGe diffused fin portion forms an integrated SiGe fin. A sacrificial oxide layer 114 is formed on an upper surface of the SiGe diffused fin portion 116.

Figure 17:
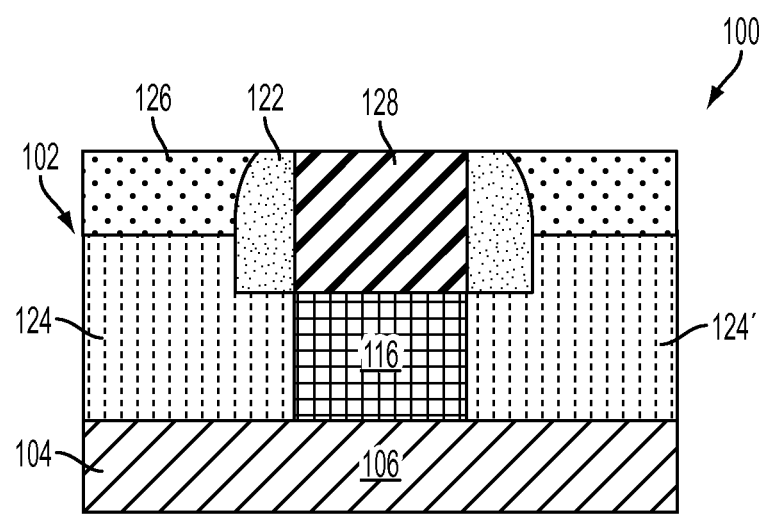
FIG. 17 illustrates the semiconductor device of FIG. 16 following removal of the oxide layer and formation of a metal gate stack on the silicon germanium gate channel.

Referring to FIG. 17, the sacrificial oxide layer 114 is removed, and a metal gate stack 128 is formed according to a RMG process understood by those ordinarily skilled in the art. Accordingly, a PFET structure 102 is formed including SiGe gate channel having a high-concentration of Ge ions such as, for example, greater than or equal to approximately 50% of Ge ions, which improves electron hole mobility therethrough.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the operations described therein without departing from the spirit of the invention. For instance, the operations may be performed in a differing order or various operations may be added, deleted or modified. All of these variations are considered a part of the claimed invention.

While the various embodiments have been described, it will be understood that those skilled in the art, both now and in the future, may make various modifications to one or more of the described embodiments which fall within the scope of the claims which follow. These claims should be construed to maintain the proper protection for the invention first described.

What is claimed is:

1. A method of fabricating a semiconductor device, the method comprising:
    forming at least one non-diffused semiconductor fin on a semiconductor substrate;
    depositing a block masking layer atop the semiconductor substrate to encapsulate the at least one non-diffused semiconductor fin;
    partially etching the block masking layer to expose an upper portion of the at least one semiconductor fin while encapsulating a lower portion of the at least one non-diffused semiconductor fin;

epitaxially growing a cladding layer on the upper portion of the at least one non-diffused semiconductor fin;

oxidizing the cladding layer such that ions are condensed therefrom and are diffused into the previously at least one non-diffused semiconductor fin while the cladding layer is converted to an oxide layer to form at least one converted semiconductor fin; and removing the oxide layer to expose the at least one converted semiconductor fin having a diffused fin portion that enhances electron hole mobility therethrough, wherein bare surfaces of semiconductor material of the upper portion of the at least one non-diffused semiconductor fin are annealed prior to epitaxially growing the cladding layer.

2. The method of claim 1, wherein the non-diffused semiconductor fin is formed from silicon, the cladding layer is formed from silicon germanium, and the condensed ions are germanium ions that convert the at least one non-diffused semiconductor fin into a silicon germanium fin in response to the diffusing.

3. The method of claim 2, wherein the percentage of germanium ions in the silicon germanium fin are greater than 50 percent with respect to silicon ions.

4. The method of claim 1, wherein the oxidizing the cladding layer is performed using one of a dry thermal oxidation process or a wet thermal oxidation process.

5. The method of claim 4, wherein the forming at least one non-diffused semiconductor fin comprises:

forming a first plurality of silicon fins on the semiconductor substrate to define a PFET;

forming a second plurality of silicon fins on the semiconductor substrate to define an NFET;

selectively growing the silicon germanium cladding layer on the first plurality of silicon fins; and oxidizing the silicon germanium cladding layer to form a plurality of silicon germanium fins on the PFET while maintaining the plurality of silicon fins on the NFET.

6. The method of claim 4, further comprising forming a gate stack after forming the silicon germanium fin.

7. The method of claim 6, further comprising forming the gate stack on an upper surface and sidewalls of the silicon germanium fin such that a silicon germanium gate channel is formed beneath the gate stack to enhance electron hole mobility therethrough.

8. A method of fabricating a semiconductor device, the method comprising:

patterning a bulk non-heterojunction semiconductor substrate to form at least one non-diffused semiconductor fin comprising a non-heterojunction semiconductor material;

forming a gate stack including a dummy gate on the non-heterojunction semiconductor material of the at least one non-diffused semiconductor fin, and forming spacers on sidewalls of the dummy gate;

removing the dummy gate between the spacers to expose a portion of the non-heterojunction semiconductor material;

epitaxially growing a cladding layer on the exposed non-heterojunction semiconductor material of the at least one non-diffused semiconductor fin;

oxidizing the cladding layer such that ions are condensed therefrom and are diffused into the at least one previously non-diffused semiconductor fin to form a heterojunction gate channel while the cladding layer is converted to an oxide layer; and removing the oxide layer to expose the at least one semiconductor fin having a diffused fin portion that extends between opposing first and second source/drain regions, the diffused fin portion defines a heterojunction gate channel of the semiconductor device while a remaining portion of the at least one non-diffused semiconductor fin maintains the non-heterojunction semiconductor material, wherein the silicon germanium gate channel is below the first and second spacers and completely below an upper surface of the first and second source/drain regions.

9. The method of claim 8, wherein the non-heterojunction semiconductor material of the at least one non-diffused semiconductor fin is formed from silicon, the cladding layer is formed from silicon germanium, and the condensed ions are germanium ions such that the heterojunction gate channel comprises a silicon germanium diffused portion to defining a silicon germanium gate channel that enhances electron hole mobility therethrough.

10. The method of claim 9, wherein the percentage of germanium ions in the silicon germanium gate channel are greater than 50 percent with respect to silicon ions.

11. The method of claim 10, wherein the oxidizing the cladding layer is performed using one of a dry thermal oxidation process or a wet thermal oxidation process.

12. A semiconductor device, comprising:
a semiconductor substrate; and
at least one semiconductor fin formed on the semiconductor substrate, the at least one semiconductor fin including a diffused portion comprising first and second ions, and a non-diffused portion excluding the second ions; and a gate stack on an upper surface and sidewalls of the at least one silicon germanium fin such that a silicon germanium gate channel is formed beneath the gate stack to enhance electron hole mobility therethrough, while the non-diffused portion extends from the silicon germanium gate channel to the semiconductor substrate;

a first spacer on a first sidewall of the gate stack and a second spacer on an opposing sidewall of the gate stack;

a first source/drain region on the at least one semiconductor fin and adjacent the first sidewall of the gate stack, and a second source/drain region on the at least one semiconductor fin and adjacent the opposing sidewall of the gate stack, wherein the silicon germanium gate channel is below the first and second spacers and completely below an upper surface of the first and second source/drain regions.

13. The semiconductor device of claim 12, wherein the diffused portion is integrated within the semiconductor fin.

14. The semiconductor device of claim 13, wherein the at least one semiconductor fin excludes a seeding layer between the diffused portion and the non-diffused portion.

15. The semiconductor device of claim 14, wherein the first ions are silicon ions and the second ions are germanium ions to form a silicon germanium diffused portion in the at least one semiconductor fin.

16. The semiconductor device of claim 15, wherein the percentage of germanium ions in the silicon germanium fin are greater than 50 percent with respect to silicon ions.

17. The semiconductor of claim 16, wherein the at least one semiconductor fin comprises: a first plurality of silicon germanium fins formed on the semiconductor substrate to define a PFET, each silicon germanium fin comprising the diffused portion including the silicon ions and the germanium ions; and a second plurality of silicon fins formed on the semiconductor substrate to define an NFET, the second plurality of silicon fins excluding the diffused portion.

* * * * *